United States Patent [19]
Park et al.

[11] Patent Number: 5,804,907
[45] Date of Patent: Sep. 8, 1998

[54] HIGH STRAIN ACTUATOR USING FERROELECTRIC SINGLE CRYSTAL

[75] Inventors: Seung-Eek Park, State College; Thomas R. Shrout, Port Matilda, both of Pa.

[73] Assignee: The Penn State Research Foundation, University Park, Pa.

[21] Appl. No.: 789,579

[22] Filed: Jan. 28, 1997

[51] Int. Cl.⁶ ................................................ H01L 41/04
[52] U.S. Cl. ........................ 310/358; 310/360; 310/357
[58] Field of Search .................................. 310/358, 360, 310/357, 331, 361

[56] References Cited

U.S. PATENT DOCUMENTS

| | | | |
|---|---|---|---|
| 4,109,359 | 8/1978 | Cross et al. ........................ | 29/25.35 |
| 5,295,487 | 3/1994 | Saitoh et al. ........................ | 128/662.03 |
| 5,402,791 | 4/1995 | Saitoh et al. ........................ | 128/662.03 |

*Primary Examiner*—Mark O. Budd
*Assistant Examiner*—Timothy A. Williams
*Attorney, Agent, or Firm*—Thomas J. Monahan

[57] ABSTRACT

An actuator incorporating the invention includes a body of a ferroelectric material. The material is single crystalline and incorporates solid solutions of lead zinc niobate-lead titanate or lead magnesium niobate-lead titanate, described by the formulae: $Pb(Zn_{1/3}Nb_{2/3})_{1-x}Ti_xO_3$ and $Pb(Mg_{1/3}Nb_{2/3})_{1-y}Ti_yO_3$] where x and y are defined as $0 \leq x < 0.10$, and $0 \leq y < 0.40$. Electrodes enable application of an electric field across the body in a direction that is generally aligned with a <001> crystallographic axis of the ferroelectric material.

6 Claims, 13 Drawing Sheets

HIGH STRAIN ACTUATOR USING FERROELECTRIC SINGLE CRYSTAL

GOVERNMENT SPONSORSHIP

This invention was made with Government support under Grant No. N00014-93-J-0502 awarded by the U.S. Department of the Navy. The Government has certain rights in the invention.

YIELD OF THE INVENTION

This invention relates to electromechanical actuators which employ ferroelectrics and, more particularly, to an electromechanical actuator that is constructed with single crystals of lead zinc niobate-lead titanate or lead magnesium niobate-lead titanate solid solutions.

BACKGROUND OF THE INVENTION

Electromechanical actuators constructed from piezoelectric or electrostrictive ceramics are used in applications requiring high generative force, high frequency operation, accurate displacement, quick response time, or small device sizes. However, low field induced strain and poor reliability limit the usage of such ceramics for actuator applications.

Electric field induced strain is the most important parameter for actuators. This is demonstrated by the strain energy density which is a measure of the energy per unit mass an actuator can deliver, $$e_{max} = 1/\rho \cdot 1/4 \cdot (1/2 \cdot E(\epsilon_{max})^2)$$

where: $e_{max}$ is the strain energy density E is the actuator's elastic modulus, $\epsilon_{max}$ is the maximum field induced strain, and $\rho$ is the actuator's density. In designing an actuator, the maximum strain energy density should be as high as possible. In electroactive ceramics, density and elastic modulus vary little from material to material. Therefore, level of strain and maximum strain achievable with a reasonable electric field (<50 kV/cm) dominates the energy density parameter.

Strain for a given electric field is determined from a material's piezoelectric coefficient ($d_{33}$). Soft lead-zirconate-titanates (PZT's) and perovskite relaxor-PT(Pb(($B_1B_2$)$O_3$-PbTiO$_3$, (where $B_1$=Mg$^{+2}$, Zn$^{+2}$, Ni$^{+2}$, Sc$^{+3}$, . . . and $B_2$=Nb$^{+5}$, Ta$^{+5}$, W$^{+6}$, . . .) based morphotropic phase boundary (MPB) ceramics offer piezoelectric coefficients ~600 to 700 pC/N. However, the best available actuators offer a maximum strain of not more than 0.15%. This limitation originates from the material's breakdown strength and polarization saturation.

Soft PZT's and relaxor-PbTiO$_3$ based ceramics are compositionally engineered to have morphotrophic phase boundary (MPB) composition and further engineered to have a decreased paraelectric-ferroelectric transition temperature (Tc), resulting in high piezoelectric coefficients. However, this increased piezoelectric activity comes with the expense of large hysteresis, ascribed to electric field induced domain motion. This results in poor positioning accuracy and large heat generation. Heat generation combined with decreased temperature usage range, also results in poor temperature stability of piezoelectric properties. This limits the driving frequency, prohibiting the usage of these high piezoelectric coefficient ceramics for high frequency driving applications.

Strain can be hysteresis minimized with hard piezoelectric ceramics, which exhibit decreased piezoelectric coefficient ($d_{33}$). A hard piezoelectric, such as PZT-4, exhibits piezoelectric coefficients of ~200 to 300 pC/N.

Another category of ceramic materials used in commercial actuators is electrostrictors. Electrostriction strain is proportional to the square of an applied electric field. A few materials such as lead magnesium niobate (PMN) or lead magnesium niobate-lead titanate (PMN-PT) solid solution ceramics with low lead titanate (PT) content exhibit a significant strain (>0.1%) with virtually no hysteresis.

In summary, the problems of commercially available piezoelectric and electrostrictive ceramics are:

1) Low total strain ($\leq 0.15\%$).
2) Low strain energy density due to low piezoelectric coefficient ($d_{33}$) <700 pC/N and electrical breakdown strength.
3) Significant hysteresis which leads to substantial heat generation and poor positioning accuracy.

To achieve strains >0.15%, electroactive materials should possess high piezoelectric coefficients ($d_{33}$ >1000 pC/N) and high breakdown strength.

In the main, the prior art electroactive materials described above are based upon multi-crystalline structures. Saitoh et al. in U.S. Pat. Nos. 5,295,487 and 5,402,791 describe a range of piezoelectric single crystal materials which exhibit large electromechanical coupling coefficients and teach their use as ultrasound transducers. One set of materials taught by Saitoh et al. is based upon single crystals in the form of solid solutions of zinc lead niobate-lead titanate. Another set of single crystals is given by the formula

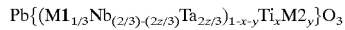

where M1 represents one of metals Zn, Ni and Mg, and M2 represents one of Pt, Fe, Bi, Rh and Ir, and x, y and z are defined as $0.05 \leq x \leq 0.2$, $0.00001 \leq y \leq 0.01$ and $0 \leq z \leq 0.1$, respectively.

There is no teaching by Saitoh et al. that only a certain subset of their materials will exhibit a high strain factor (it being known to those skilled in the art that high coupling coefficients do not necessarily equate to high strain factors). As will be apparent from the description of the invention below, Applicants have discovered that a subset of the materials of Saitoh et al. exhibit large strains so long as an electric field is applied thereto generally along the 001 crystalline axis.

Accordingly, it is an object of the invention to provide an improved piezoelectric actuator.

It is another object of the invention to provide an improved ferroelectric actuator which exhibits minimal hysteresis losses.

SUMMARY OF THE INVENTION

An actuator incorporating the invention includes a body of a ferroelectric material. The material is single crystalline and incorporates solid solutions of lead zinc niobate-lead titanate or lead magnesium niobate-lead titanate, described by the formulae: Pb(Zn$_{1/3}$Nb$_{2/3}$)$_{1-y}$Ti$_y$O$_3$, and Pb(Mg$_{1/3}$Nb$_{2/3}$)$_{1-y}$Ti$_y$O$_3$, where x and y are defined as $0 \leq x < 0.10$, and $0 \leq y < 0.40$. Electrodes enable application of an electric field across the body in a direction that is generally aligned with a <001>crystallographic axis of the ferroelectric material.

DETAILED DESCRIPTION OF THE PREFERRED EMBODIMENTS OF THE INVENTION

It has been found that certain single crystal ferroelectrics will evidence very high strain values if their constituents restrict their crystalline form to the rhombohedral structure and an electric field is applied thereacross so as to be in general alignment with the <001>crystallographic axis. Such ferroelectrics exhibit very low levels of hysteresis and thus may be driven at relatively high frequencies without overheating. The materials comprising the invention are preferably in solid solution form.

Single crystalline ferroelectrics, which exhibit large strain and low hysteresis and are usable with actuators incorporating the invention, are solid solutions of lead zinc niobate-lead titanate or lead magnesium niobate-lead titanate, which possesses a large piezoelectric coefficient (d$_{33}$~1000 pC/N to 2500 pC/N), and a maximum strain >1.2%.

Figure 1:
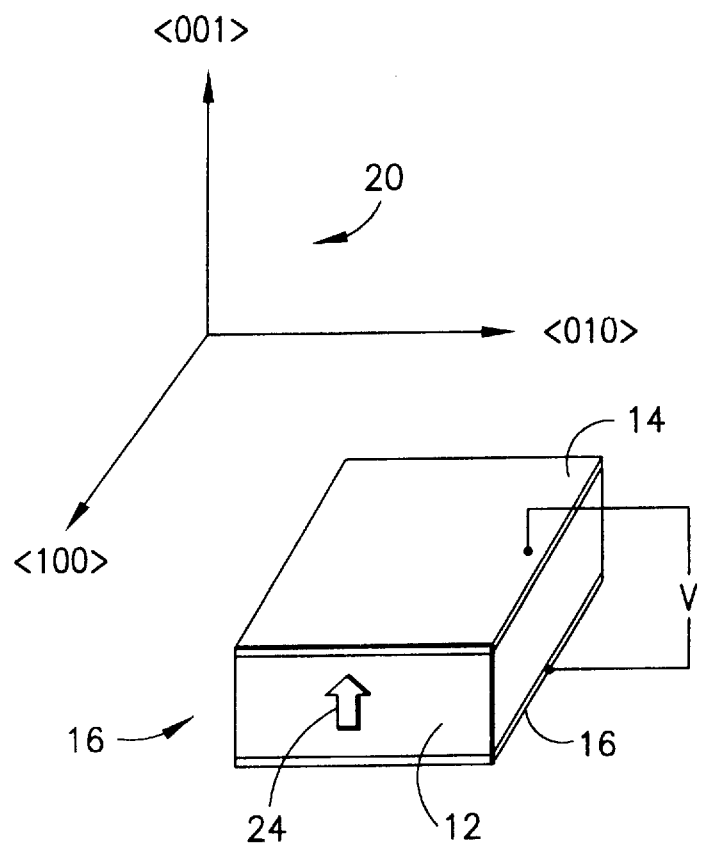
FIG. 1 shows a perspective view of an actuator incorporating a single crystalline ferroelectric wherein an electric field is applied along the <001> crystallographic axis.

In FIG. 1, an actuator 10 incorporating the invention comprises a ferroelectric body 12 that is bounded by conductive electrodes 14 and 16. Body 12 comprises a single crystal solid solution of the chosen ferroelectric composition and the crystal axes of the crystal are generally aligned as shown by coordinates 20. When a voltage V is applied across electrodes 14 and 16, ferroelectric body 12 is poled as shown by arrow 24.

A ferroelectric single crystal according to the present invention is described by formulae 1 and 2 below:

$$Pb(Zn_{1/3}Nb_{2/3})_{1-x}Ti_xO_3 \tag{1}$$

$$Pb(Mg_{1/3}Nb_{2/3})_{1-y}Ti_yO_3 \tag{2}$$

where: x and y are defined as $0 \leq x < 0.10$, and $0 \leq y < 0.40$, respectively. If x>0.1 and y>0.4, the single crystals have a tetragonal structure with piezoelectric coefficients as low as 500 pC/N.

A more preferred range of limits for x and y are $0 \leq x < 0.09$, and $0 \leq y < 0.35$, resulting in rhombohedral crystalline structure. In the range of $0.09 \leq x \leq 0.1$ and $0.35 \leq y \leq 0.4$, crystals lie on morphotropic phase boundaries (MPB), with coexisting rhombohedral and tetragonal phases. In spite of observed strain as high as 1% and large low field piezoelectric coefficients (d$_{33}$±1500 pC/N) for MPB crystals, large hysteresis associated with domain motion and phase transition is observed when strain is plotted versus applied electric field for such MPB crystals. Thus while such compositions are usable and exhibit large strain values, their range of applications is not as wide as materials in the more preferred ranges of x and y.

Piezoelectric single crystals of formulae 1 and 2 should be oriented and poled generally along the pseudocubic <001> direction to obtain a large strain value with little or no hysteresis effects.

EXPERIMENTAL

The piezoelectric coefficients (d$_{33}$) of lead zinc niobate-lead titanate and lead magnesium niobate-lead titanate solid solution single crystals were measured using direct observation of strain as a function of electric field as well as calculations based on IRE standards.

The crystals were fabricated as follows: High purity (>99.9%) powders of Pb$_3$O$_4$, ZnO, MgCO$_3$, Nb$_2$O$_5$ and TiO$_2$ were used as starting material. Raw powders were weighed with desired molar ratio with excess Pb$_3$O$_4$ as a flux. The powder was dry mixed for a desired period of time using a tumbling mill. Mixed powder was loaded into a platinum crucible, which was then placed in an alumina crucible sealed with an alumina lid and alumina cement to minimize PbO volatilization. The crucible and powder were then placed in a tube furnace and held at an appropriate soak temperature above melting temperature, followed by slow cooling. The crucible was then furnace-cooled to room temperature. Hot HNO$_3$ was used to separate the crystals out of the rest of the melt.

Crystals of lead zinc niobate—lead titanate and lead magnesium niobate—lead titanate solid solutions can similarly be fabricated using a top seeded solution growth method (TSSG), a submerged seeded solution growth method, Kyropoulous method, the hydrothermal method, solid state reaction via exaggerated grain growth and the Bridgman method, in addition to the flux method described above. Also, single crystals or pseudocrystals that consist of multiple single crystals of lead zinc niobate-lead titanate and lead magnesium niobate-lead titanate solid solutions can be fabricated using textured growth or epitaxial growth, that is, the growth of crystals of one material on the crystal surface of another material, such that the crystalline substrates of both materials have the same structural orientation.

The piezoelectric properties were measured as follows: Individual crystals were oriented along their pseudocubic <111>, <110> and <001> directions using a Laue back reflection camera. For electrical characterization, samples were prepared by polishing with silicon carbide and alumina polishing powders to achieve flat and parallel surfaces onto which gold electrodes were sputtered.

High-field measurements included polarization and strain hysteresis using a linear variable differential transducer (LVDT) driven by a lock-in amplifier (Stanford Research Systems, Model SR830). Plate shape samples with the thickness ranged from 0.2 mm to 0.5 mm were used. The voltage was supplied using a Trek 609C-6 high voltage DC amplifier. Through the LVDT sensor the strain of the samples was measured with the application of applied fields. Electric fields as high as ~140 kV/cm were applied using an amplified unipolar wave form at 0.2 Hz.

During testing the samples were submerged in Fluorinert (FC-40, 3M, St. Paul, Minn.), an insulating liquid, to prevent arcing. For piezoelectric coefficient ($d_{33}$) determination, bar shape samples with the lengths which ranged from 3 mm to 5 mm were used. Piezoelectric coefficient ($d_{33}$) was calculated based on IRE standards.

Figure 2B:
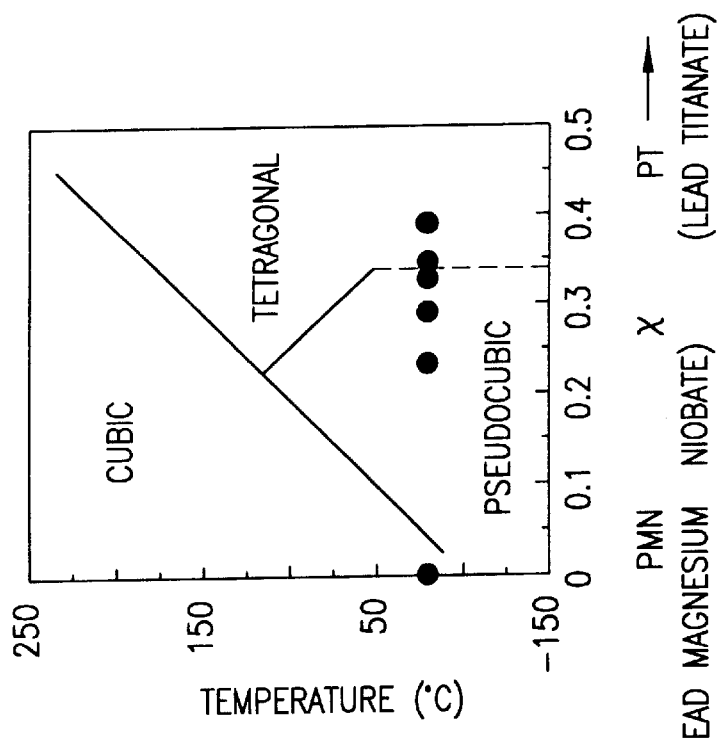
FIGS. 2a, 2b shows phase diagrams of lead zinc niobate-lead titanate and lead magnesium niobate-lead titanate solid solutions.
Figure 2A:
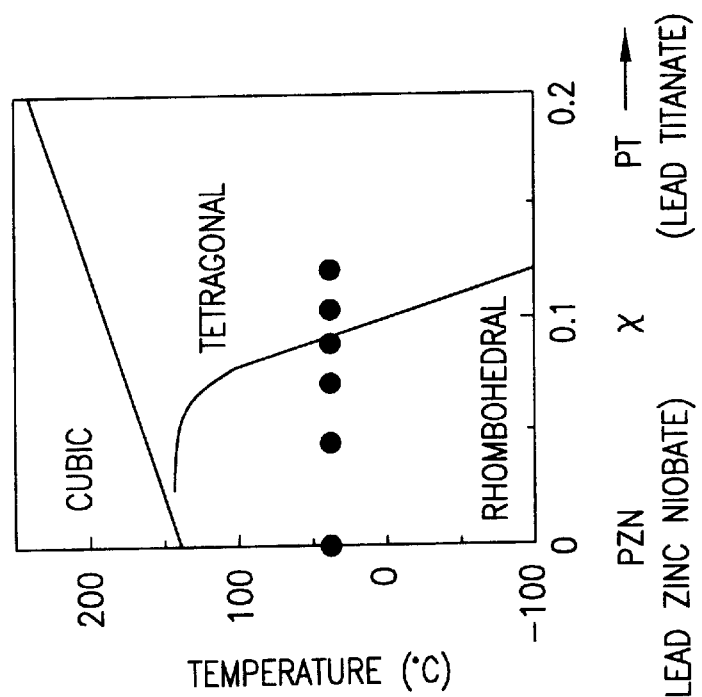

FIGS. 2a and 2b show phase diagrams of lead zinc niobate—lead titanate and lead magnesium niobate-lead titanate solid solutions, respectively. The solid dots are the crystal compositions which were tested during the development of the invention.

Table 1 presents low field dielectric and piezoelectric properties, calculated based on IRE standards, as a function of composition and crystal orientation. High piezoelectric coefficient ($d_{33}$ >1000 pC/N) crystals had a rhombohedral structure or MPB composition and orientation along pseudocubic <001> direction. Piezoelectric coefficients as high as 2200 were measured for (001) oriented rhombohedral crystals of $Pb(Zn_{1/3}Nb_{2/3})_{0.92}Ti_{0.08}O_3$ Low hysteresis behaviors are apparent from the plots of FIG. 3. That behavior can be ascribed to a stable domain configuration. Strain behavior of piezoelectric ceramics (PZT-5H) with the largest piezoelectric coefficient ($d_{33}$~750 pC/N) is compared with those of single crystals in the Fig.

Figure 4:
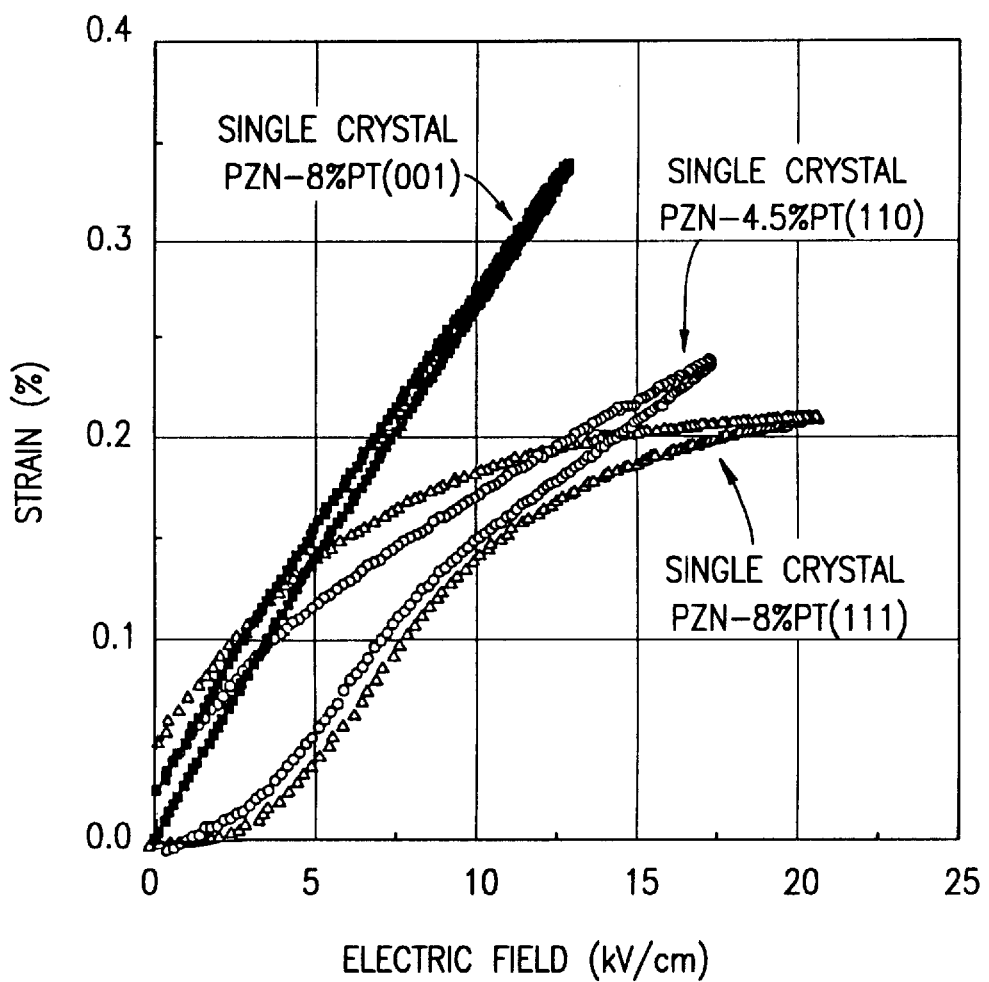
FIG. 4 shows plots of strain vs. electric field for samples with different crystal orientations.

FIG. 4 shows examples of strain vs. electric field for samples with different crystal orientations. $Pb(Zn_{1/3}Nb_{2/3})_{0.92}Ti_{0.08}O_3$ crystal oriented along the pseudocubic <111> and <001> directions and a $Pb(Zn_{1/3}Nb_{2/3})_{0.955}Ti_{0.045}O_3$ crystal oriented along the pseudocubic <110> direction were chosen as examples. E-field induced strain deviated from linearity and exhibited large hysteresis due to domain motion for crystals oriented along <111> and <110> directions. It was concluded that pseudocubic <001> was the direction resulting in a hysteresis strain.

Figure 5:
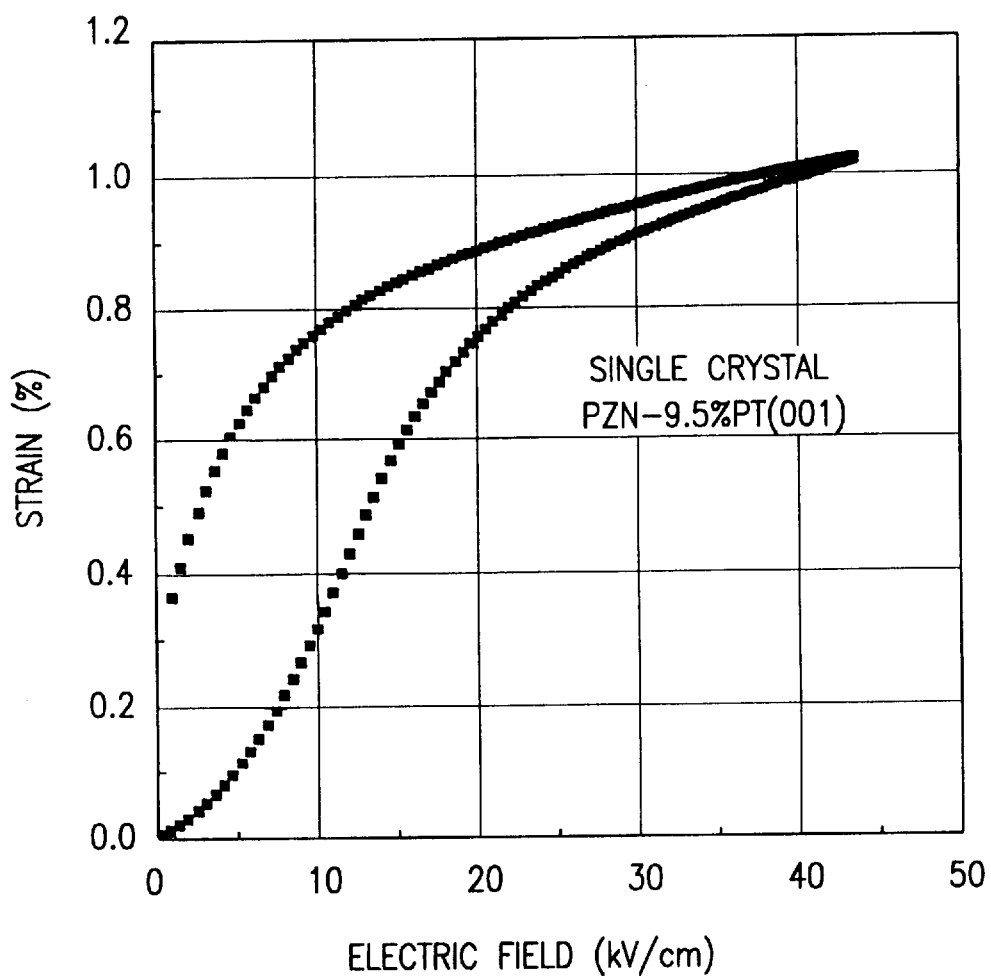
FIG. 5 shows plots of strain vs. electric field for <001> oriented Pb(Zn$_{1/3}$Nb$_{2/3}$)$_{0.905}$Ti$_{0.095}$O$_3$ crystal as an example of MPB behavior.

FIG. 5 shows the strain vs. electric field curve for <001> oriented $Pb(Zn_{1/3}Nb_{2/3})_{0.905}Ti_{0.095}O_3$ crystal as an example of MPB behavior. Strain as high as 1% was observed, with large hysteresis due to the electric field induced domain motion. It is believed that the rhombohedral-tetragonal phase transition is also related to this hysteresis. It was concluded that the crystal must be rhombohedral to have low hysteresis strain behavior.

Figure 6:
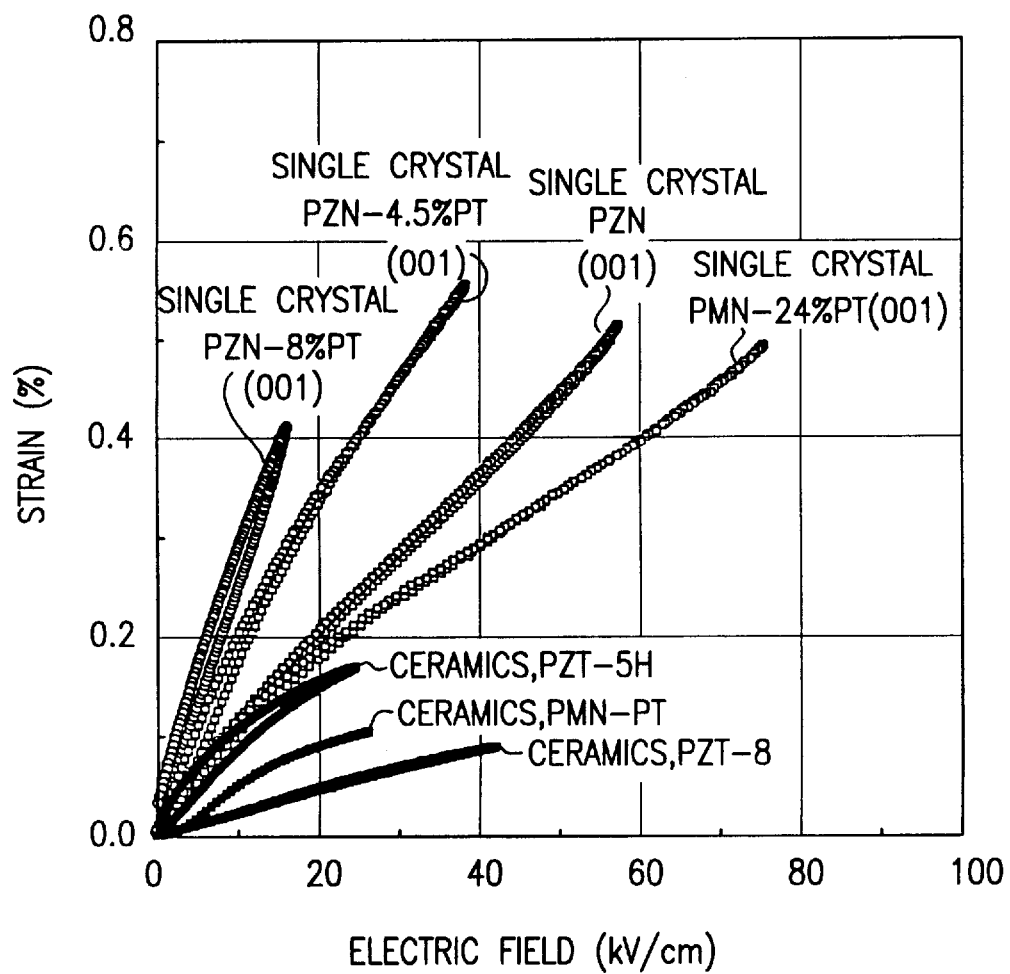
FIG. 6 shows plots of strain as a function of electric field for various <001> oriented rhombohedral crystals (Pb(Zn$_{1/3}$Nb$_{2/3}$)$_{1-x}$Ti$_x$O$_3$, (x=0,0.045,0.08) and Pb(Mg$_{1/3}$Nb$_{2/3}$)$_{1-y}$Ti$_y$O$_3$, (y=0.24), where hysteresis is low up to the maximum applied electric field.

FIG. 6 shows the strain as a function of electric field for various <001> oriented rhombohedral crystals ($Pb(Zn_{1/3}Nb_{2/3})_{1-x}Ti_xO_3$ (x=0, 0.045, 0.08) and $Pb(Mg_{1/3}Nb_{2/3})_{1-y}Ti_yO_3$ (y=0.24)), where hysteresis is low, up to the maximum applied electric field. Low hysteresis strain up to 0.55% was observed. Strains of various piezoelectric ceramics such as soft PZT (PZT-5H), hard PZT (PZT-8) and of electrostrictive ceramics are compared in the Fig.

Figure 7:
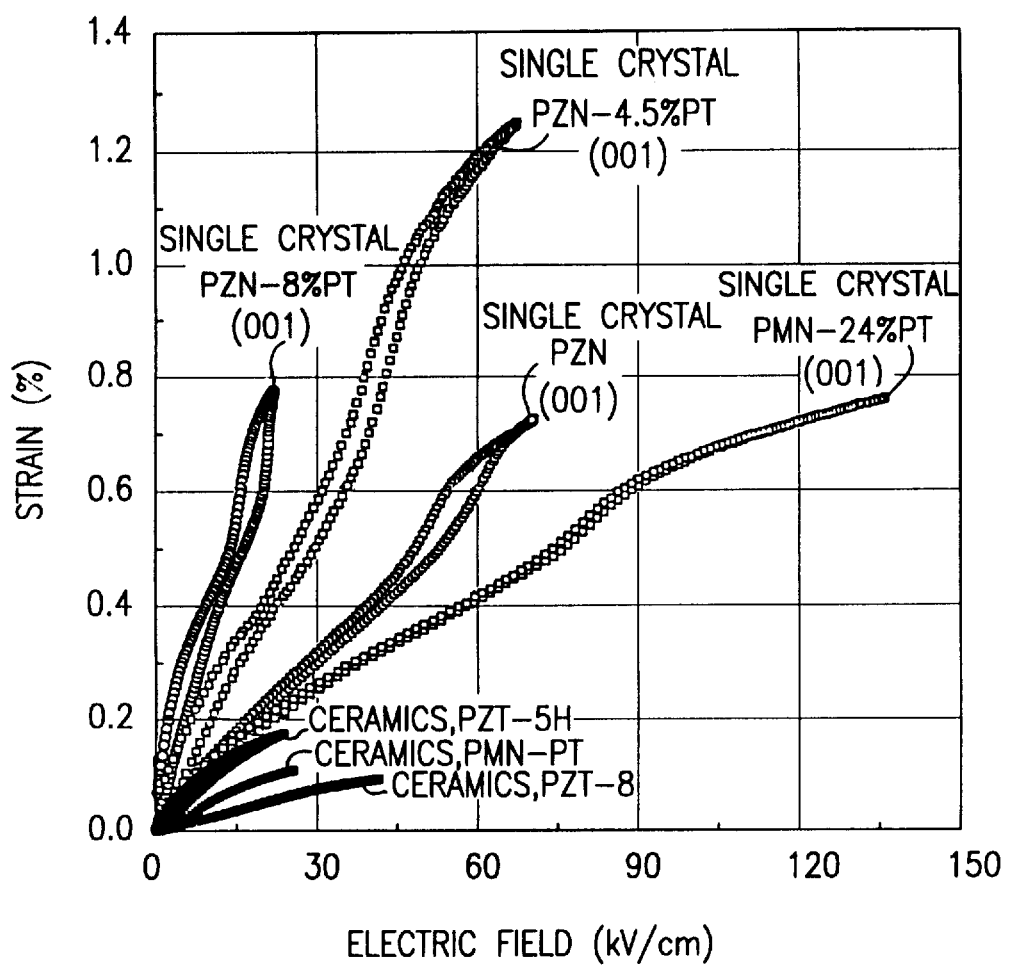
FIG. 7 shows plots of strain as a function of electric field for various <001> oriented rhombohedral crystals (Pb(Zn$_{1/3}$Nb$_{2/3}$)$_{1-x}$Ti$_x$O$_3$, (x=0,0.045,0.08) and Pb(Mg$_{1/3}$Nb$_{2/3}$)$_{1-y}$Ti$_y$O$_3$, (y=0.24), where electric field is applied until the samples electrically break down.

FIG. 7 shows the strain as a function of electric field for various <001> oriented rhombohedral crystals ($Pb(Zn_{1/3}Nb_{2/3})_{1-x}Ti_xO_3$ (x=0, 0.045, 0.08) and $Pb(Mg_{1/3}Nb_{2/3})_{1-}$

TABLE 1

Low Field Piezoelectric Properties of Various PZN-PT and PMN-PT Crystals.

| Composition | Crystal Structure | Orient. | coupling | $s_{33}^E$ ($10^{-12}$ m²/N) | $K_3^T$ | loss | $d_{33}$ (pC/N) |
|---|---|---|---|---|---|---|---|
| PZN | Rhom[1] | 111 | 0.38 | 7.4 | 900 | 0.012 | 83 |
|  |  | 001 | 0.85 | 48 | 3600 | 0.008 | 1100 |
| PZN-4.5% PT | Rhom | 111 | 0.35 | 9.0 | 1500 | 0.004 | 110 |
|  |  | 001 | 0.91 | 102 | 4000 | 0.004 | 2000 |
| PZN-8% PT | Rhom | 111 | 0.39 | 7.4 | 2150 | 0.012 | 82 |
|  |  | 001 | 0.94 | 130 | 4200 | 0.012 | 2200 |
| PZN-9.5% PT | MPB[2] | 111 | 0.64 | 10.4 | 4300 | 0.007 | 600 |
|  |  | 001 | 0.89 | 77 | 1600 | 0.004 | 1600 |
| PZN-12% PT | Tetra[3] | 001 | 0.86 |  | 900 | 0.004 | 500 |
| PMN-24% PT | Rhom | 001 |  |  | 3700 | 0.009 | 900 |
| PMN-33% PT | Rhom | 001 | 0.94 | 79 | 4500 | 0.012 | 1700 |
| PMN-35% PT | MPB | 001 | 0.92 | 67 | 3100 | 0.014 | 1240 |

[1]rhombohedral.
[2]morphotropic phase boundary - coexistence of both rhomobohedral and tetragonal phases.
[3]tetragonal.

Figure 3:
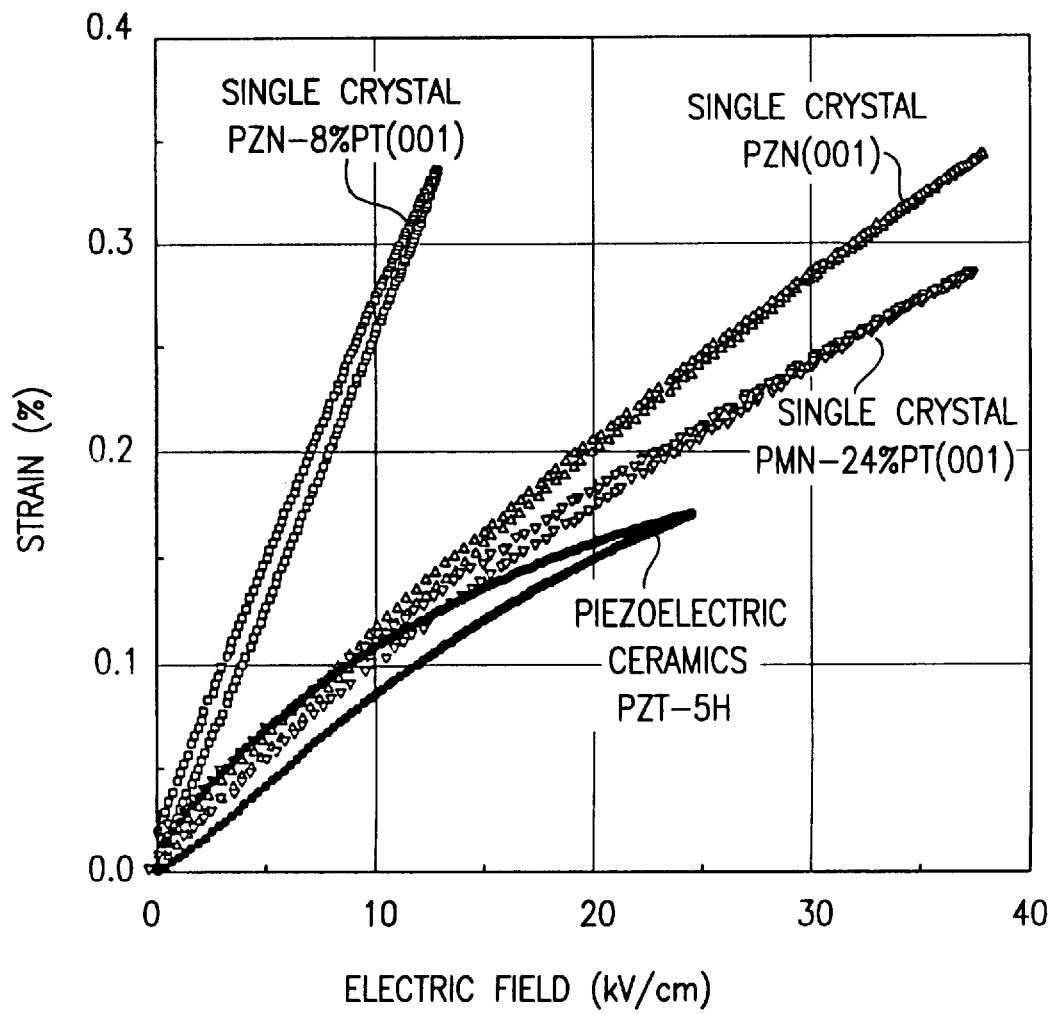
FIG. 3 shows a plot of strain as a function of electric field for <001> oriented rhombohedral crystals Pb(Zn$_{1/3}$Nb$_{2/3}$)$_{1-x}$Ti$_x$O$_3$, (x=0.0, 0.045, 0.08) and Pb(Mg$_{1/3}$Nb$_{2/3}$)$_{1-y}$Ti$_y$O$_3$, (y=0.24).

FIG. 3 shows a plot of strain as a function of electric field for various <001> oriented rhombohedral crystals ($Pb(Zn_{1/3}Nb_{2/3})_{1-x}Ti_xO_3$ (x=0, 0.045, 0.08) and $Pb(Mg_{1/3}Nb_{2/3})_{1-y}Ti_yO_3$ (y=0.24)). Piezoelectric coefficients ($d_{33}$) directly calculated from the slope of strain vs. electric field curves confirmed the values of piezoelectric coefficients presented in Table 1. A $d_{33}$ value >2500 pC/N was directly measured from the slope of the strain versus electric field curve for a <001> oriented $Pb(Zn_{1/3}Nb_{2/3})_{0.92}Ti_{0.08}O_3$ crystal.

$_yTi_yO_3$ (y=0.24)), where electric field is applied until the samples electrically break down. Samples undergo an electric field induced rhombohedral-tetragonal transition, resulting in hysteresis. Strains as high as 0.8% were observed for all tested crystal samples. $Pb(Zn_{1/3}Nb_{2/3})_{0.955}Ti_{0.045}O_3$ crystal did not experience electric break down within the voltage limit of apparatus, resulting in strain >1.2%.

Figure 8:
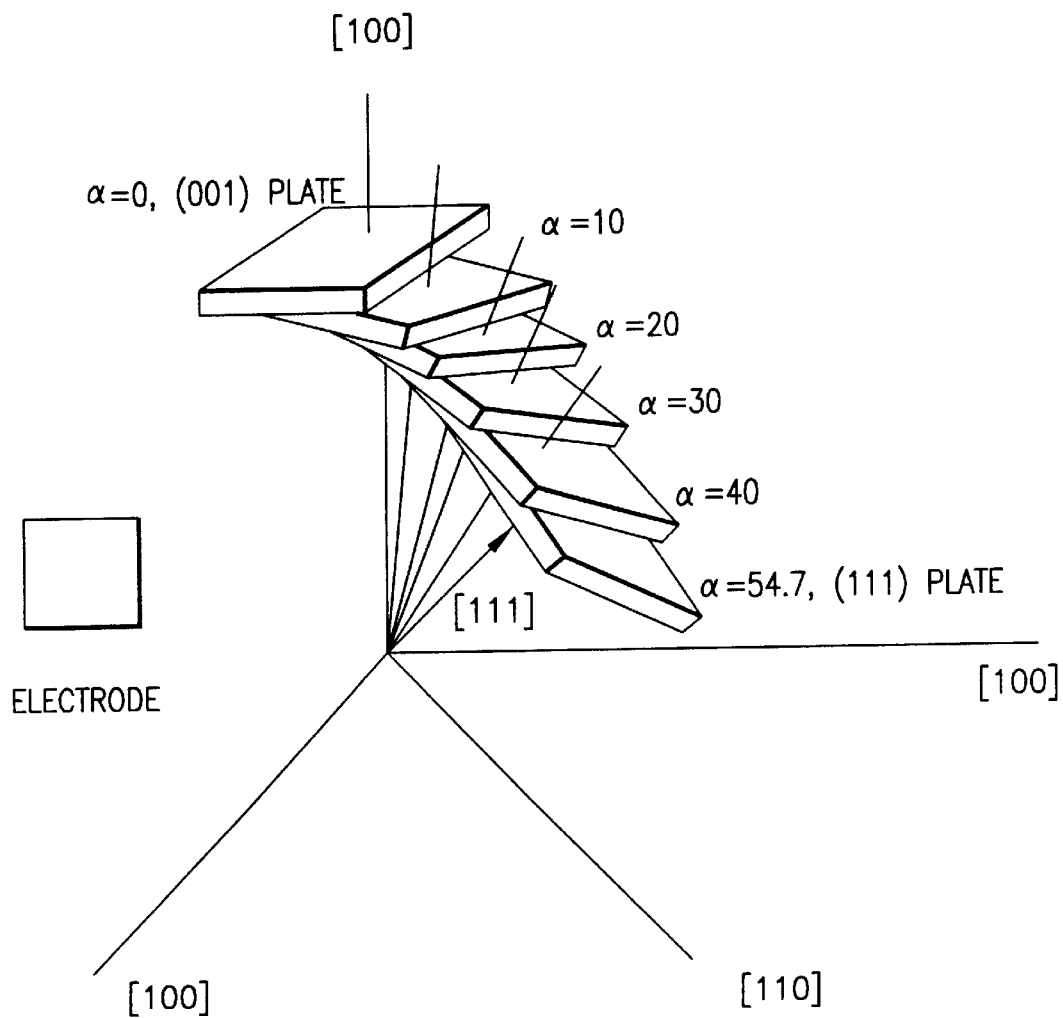
FIG. 8 shows representative Pb(Zn$_{1/3}$Nb$_{2/3}$)$_{0.955}$Ti$_{0.045}$O$_3$ crystals oriented along <001>+α direction, where α is the degree of deviation toward <111> from the exact <001> direction.

FIGS. 8–11 are plots which demonstrate that strain values of materials having the preferred composition ratios vary when the electric field is not aligned with the <001> crystallographic axis. However it is to be noted that so long as the electric field vector is within +/− 20°, that acceptable strain values and hysteresis levels are obtained. More specifically, FIG. 8 shows representative Pb $(Zn_{1/3}Nb_{2/3})_{0.955}Ti_{0.045}O_3$ crystals oriented along <001>+α direction, where α is the degree of deviation toward <111> from the exact <001> direction. This Fig. illustrates the deviation of the crystal orientation from an electric field applied along the <001> axis.

Figure 9:
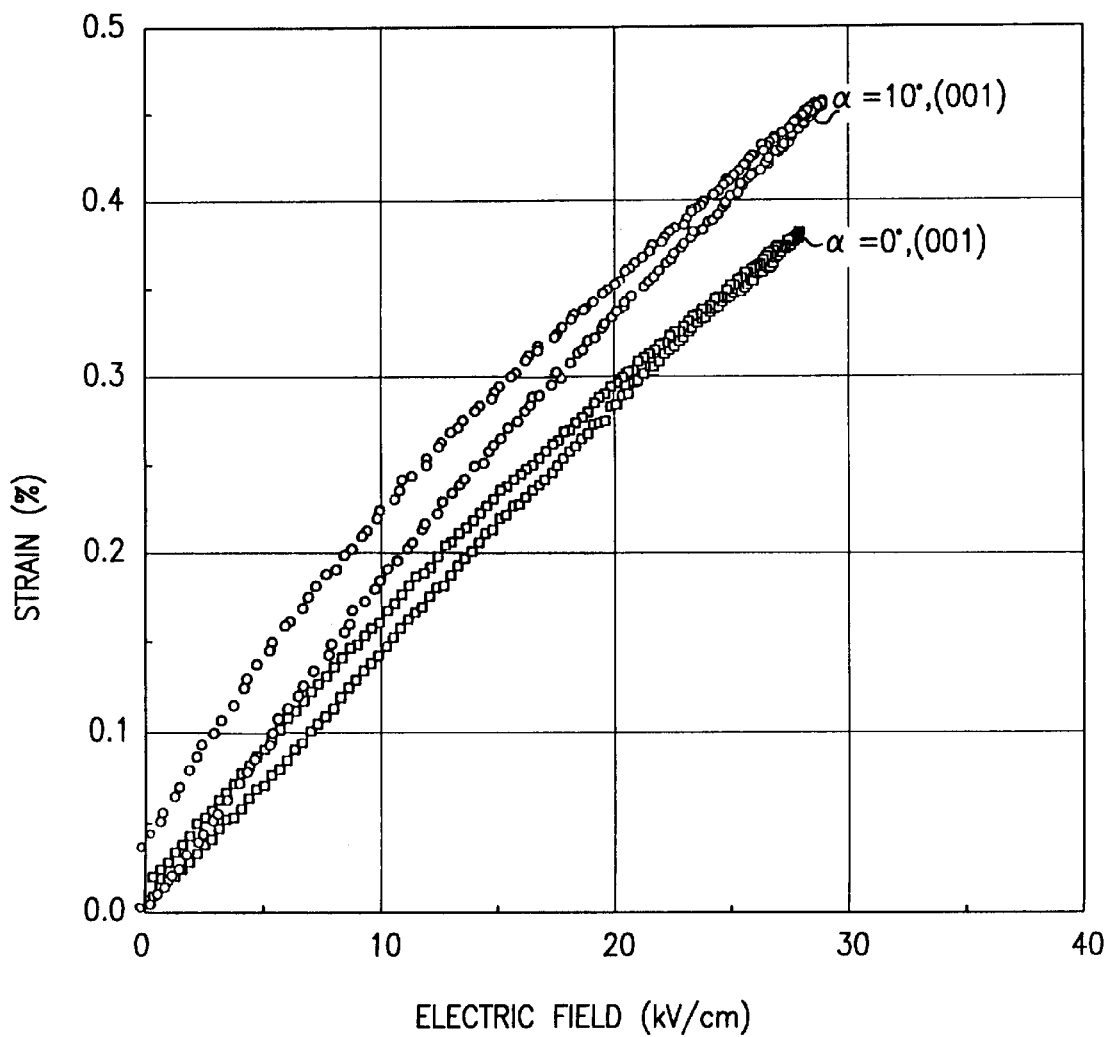
FIGS. 9, 10 show plots of low field (<40 kV/cm) strain behavior for Pb(Zn$_{1/3}$Nb$_{2/3}$)$_{0.955}$Ti$_{0.045}$O$_3$ crystals oriented along <001>+α direction, where α is the degree of deviation toward <111> from the exact <001> direction, for various values of α.
Figure 10:
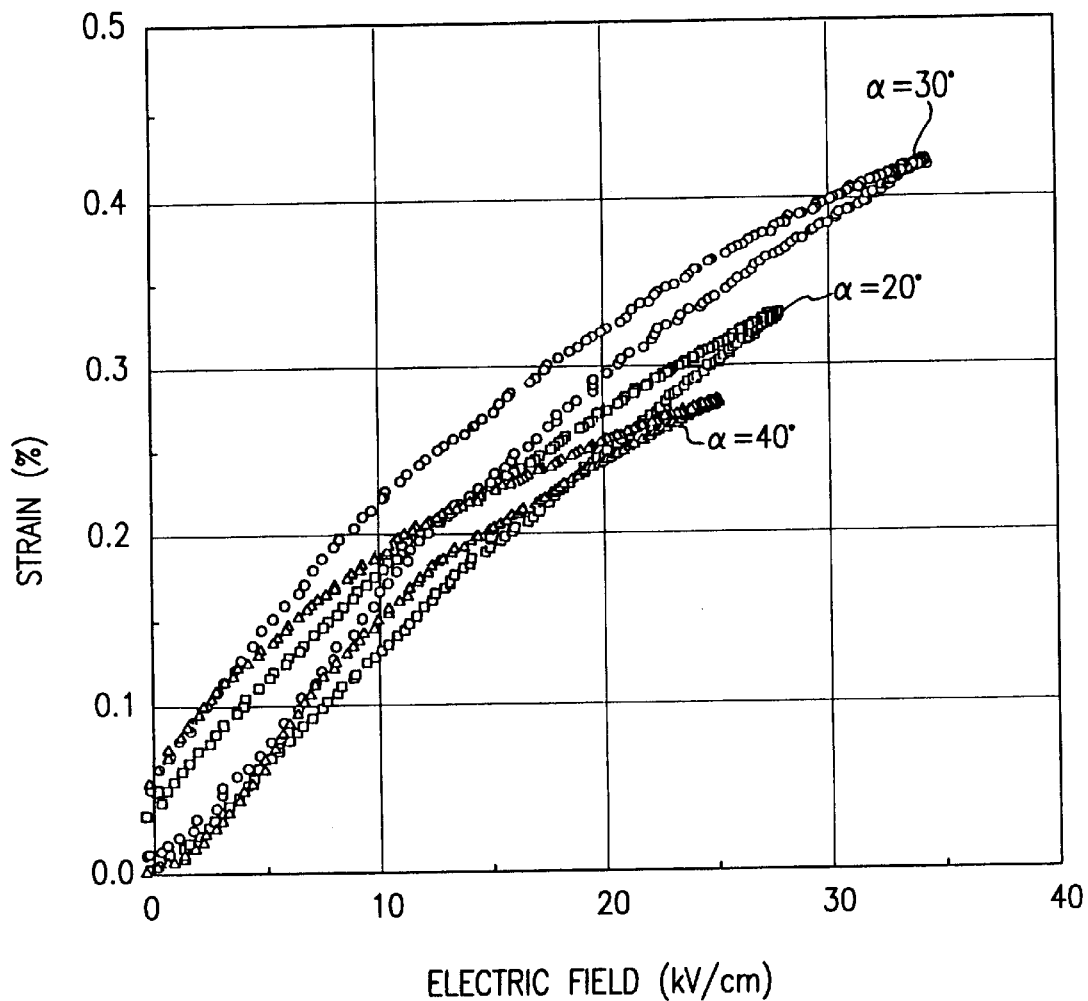

FIGS. 9, 10 shows plots of low field (<40 kV/cm) strain behavior for $Pb(Zn_{1/3}Nb_{2/3})_{0.955}Ti_{0.045}O_3$ crystals oriented along <001>+α direction, were α is the degree of deviation toward <111> from the exact <001> direction, for various values of α. It is to be noted that when α exceeds 20°, the level of hysteresis increases substantially.

Figure 11:
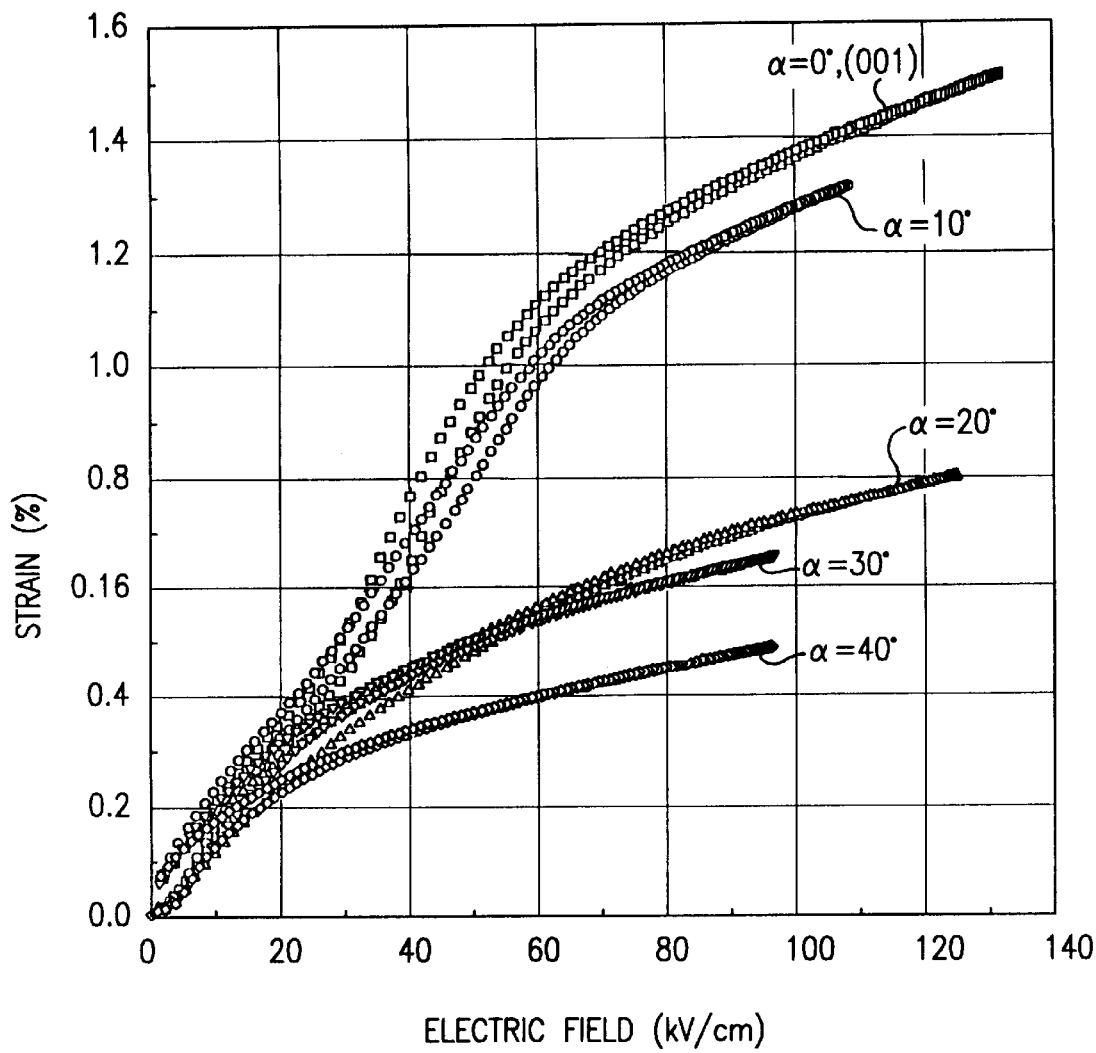
FIG. 11 shows plots of high field (=100 kV/cm) strain behavior for Pb(Zn$_{1/3}$Nb$_{2/3}$)$_{0.955}$Ti$_{0.045}$O$_3$ crystals oriented along <001>+α direction, where α is the degree of deviation toward <111> from the exact <001> direction, for various values of α.

FIG. 11 shows plots of high field (100 kV/cm) strain behavior for $Pb(Zn_{1/3}Nb_{2/3})_{0.955}Ti_{0.045}O_3$ crystals oriented along <001>+α direction, where α is the degree of deviation toward <111> from the exact <001> direction, for various values of α. It is to be noted that when α exceeds 20°, the achievable strain value decreases markedly. Further, increased breakdown strength allowed a <001> crystal to exhibit strain as high as 1.5%.

Figure 12:
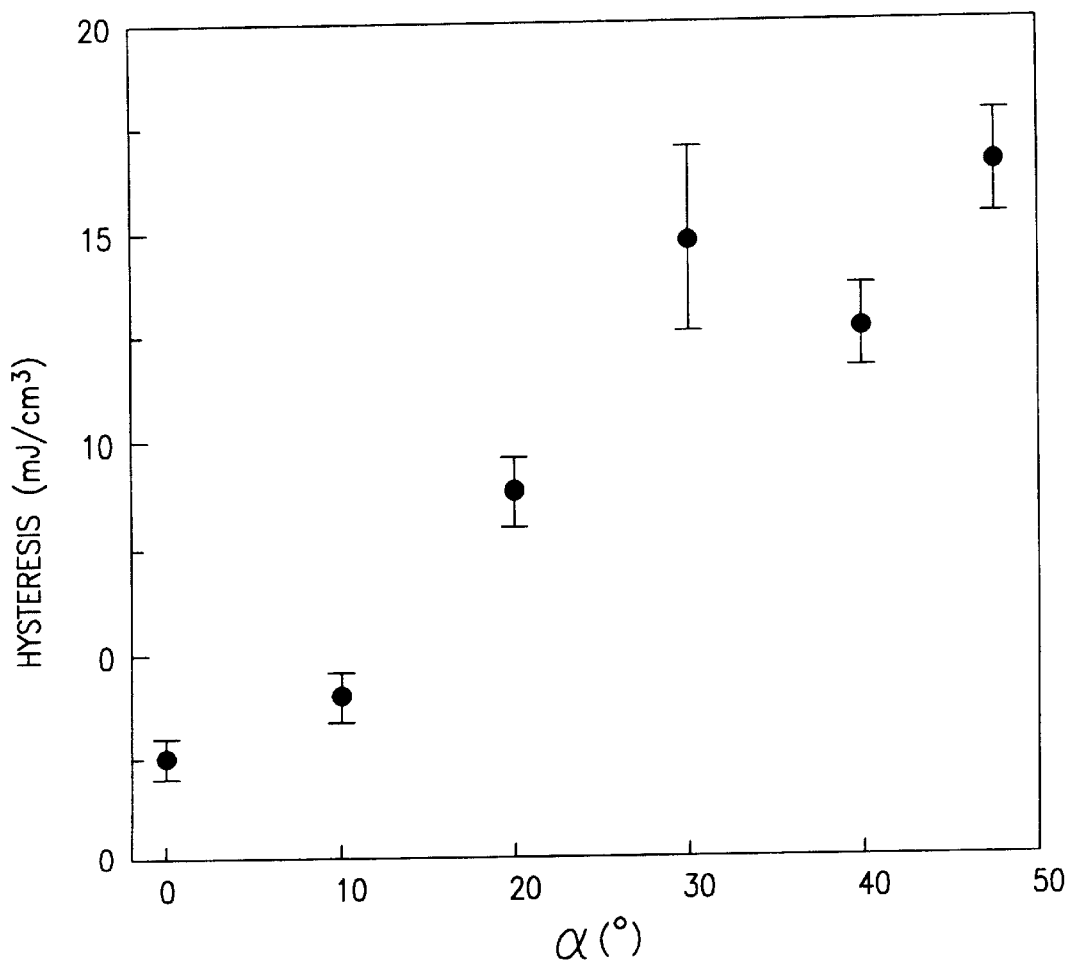
FIG. 12 shows a plot of hysteresis as a function of a for Pb(Zn$_{1/3}$Nb$_{2/3}$)$_{0.955}$Ti$_{0.045}$O$_3$ crystals oriented along <001>+α direction, where α is the degree of deviation toward <111> from the exact <001> direction.

FIG. 12 shows a plot of hysteresis as a function of α for $Pb(Zn_{1/3}Nb_{2/3})_{0.95}Ti_{0.045}O_3$ crystals oriented along <001>+α direction. Hysteresis values were calculated from polarization vs. unipolar electric field when the maximum applied field was 20 kV/cm for all crystals. FIG. 12 indicates that hysteresis caused by domain motion increases with increased value of α, resulting in more heat generation. The increased hysteresis also implies that strain values are not reproducible at the same electric field, a characteristic which is to be avoided for positioner applications.

Figure 13:
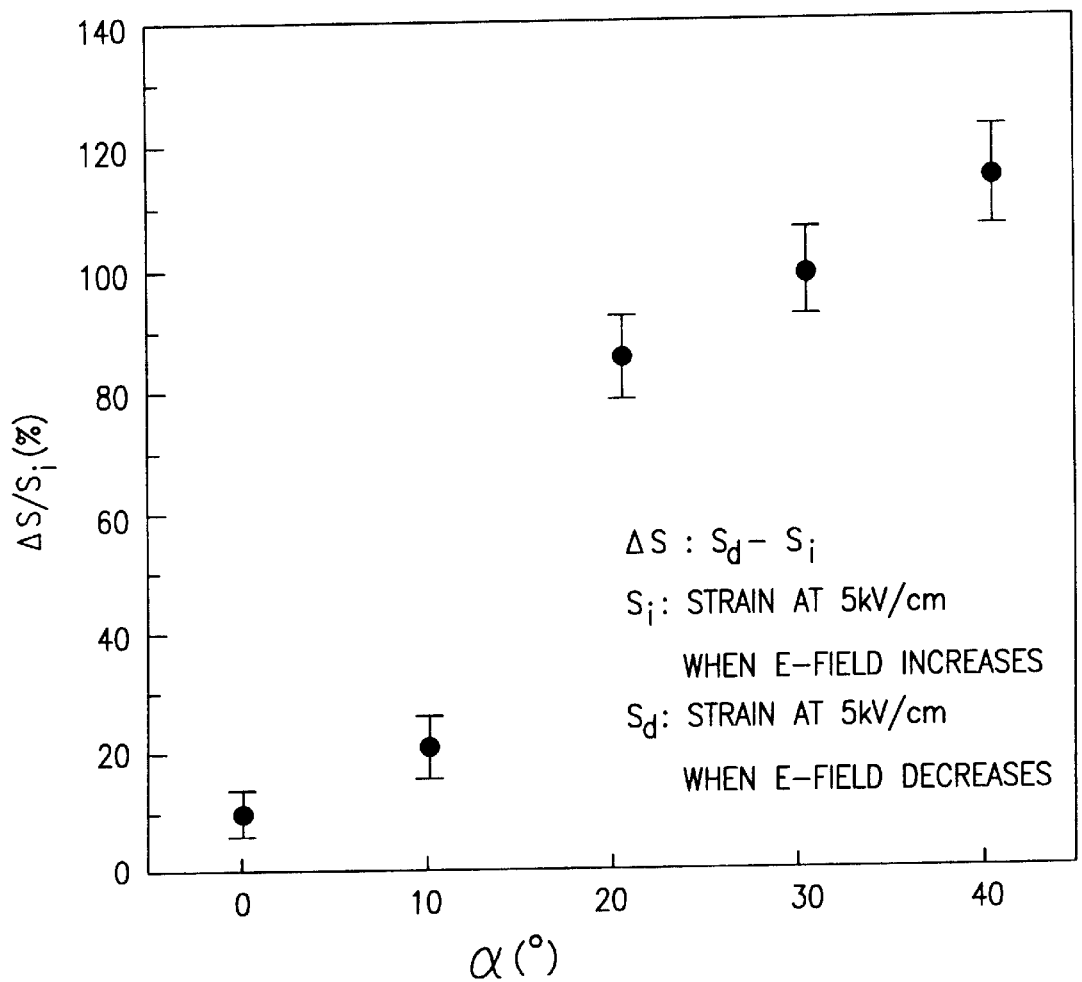
FIG. 13 shows a plot of strain hysteresis as a function of α for Pb(Zn$_{1/3}$Nb$_{2/3}$)$_{0.955}$TiO$_{0.045}$O$_3$ crystals oriented along <001>+α direction, where α is the degree of deviation toward <111> from the exact <001> direction.

FIG. 13 shows a plot relative values of strain hysteresis as a function of α for $Pb(Zn_{1/3}Nb_{2/3})_{0.955}Ti_{0.045}O_3$ crystals oriented along <001>+α direction. Relative values of strain hysteresis were calculated from the equation $(S_d-S_i)/S_i$, where $S_d$ and $S_i$ are strain values at 5 kV/cm with increasing and decreasing the electric field, respectively, and when the maximum applied electric field was 20 kV/cm. Ideally, these values should be zero, resulting in no hysteresis of strain and perfect positional reproducibility. From FIG. 13, it is seen that strain hysteresis increases abruptly at about α=20°.

In summary, single crystals of the preferred ferroelectric compositions were found to have a piezoelectric coefficient ($d_{33}$) as high as 2500 pC/N, maximum electric field induced strains of 1.3% and very low strain-electric field hysteresis. (So long as the applied electric field was applied generally along the <001> crystallographic axis.)

It should be understood that the foregoing description is only illustrative of the invention. Various alternatives and modifications can be devised by those skilled in the art without departing from the invention. For instance, other rhombohedral relaxor—PLbTiO$_3$ crystals will likely exhibit high strain so long as their <001> crystallographic axes are oriented +/− 20° from a common directional orientation. Also, while the invention has been described in the context of a single crystal actuator configuration, pseudocrystals that consist of multiple single crystals can be utilized so long as their <001> crystallographic axes are oriented +/− 20° from a common directional orientation. These multiple single crystals can be fabricated using textured growth or epitaxial growth, that is, the growth of crystals of one material on the crystal surface of another material, such that the crystalline substrates of both materials have the same structural orientation. Accordingly, the present invention is intended to embrace all such alternatives, modifications and variances which fall within the scope of the appended claims.

We claim:

1. An actuator comprising:
   a body comprising at least one single crystal of a ferroelectric material, said ferroelectric material being either lead zinc niobate-lead titanate or lead magnesium niobate-lead titanate; and
   means for applying an electric field across said body, said electric field oriented within approximately +/− 20° of a <001> crystallographic axis of said at least one single crystal.

2. An actuator as recited in claim 1, wherein said single crystals are solid solutions of lead zinc niobate-lead titanate and lead magnesium niobate-lead titanate and have compositions represented by the formulae:

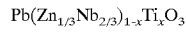

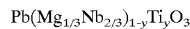

where: x and y are defined as $0 \leq x < 0.10$, and $0 \leq y < 0.40$.

3. An actuator as recited in claim 1, wherein said single crystals are solid solutions of lead zinc niobate-lead titanate and lead magnesium niobate-lead titanate and have compositions represented by the formulae:

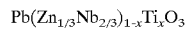

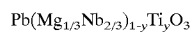

where: x and y are defined as $0 \leq x < 0.09$, and $0 \leq y < 0.35$.

4. The actuator as recited in claim 1, wherein said body comprises plural single crystals of said ferroelectric material, said plural single crystals oriented to position respective crystallographic axes thereof in approximate alignment.

5. The actuator as recited in claim 1, wherein said respective crystallographic axes are aligned within approximately +/−20°.

6. The actuator as recited in claim 1, wherein said means for applying comprises a pair of conductive electrodes which sandwich said body.

* * * * *

UNITED STATES PATENT AND TRADEMARK OFFICE
CERTIFICATE OF CORRECTION

PATENT NO. : 5,804,907
APPLICATION NO. : 08/789579
DATED : September 8, 1998
INVENTOR(S) : Seung-Eek Park et al.

It is certified that error appears in the above-identified patent and that said Letters Patent is hereby corrected as shown below:

In the Description

Column 1,
Line 4 Please correct the following heading and paragraph from
Line 4 and following, as indicated:

--GOVERNMENT SPONSORSHIP

This invention was made with Government support under Grant No. N00014-93-1-0502, awarded by the Office of Naval Research. The Government has certain rights in the invention.--

Signed and Sealed this

Sixth Day of July, 2010

David J. Kappos
*Director of the United States Patent and Trademark Office*